(12) United States Patent
Cok (10) Patent No.: US 7,402,951 B2
(45) Date of Patent: Jul. 22, 2008

(54) OLED DEVICE HAVING IMPROVED CONTRAST

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 303 days.

(21) Appl. No.: 11/235,832

(22) Filed: Sep. 27, 2005

(65) Prior Publication Data

US 2007/0069635 A1   Mar. 29, 2007

(51) Int. Cl.
*H01J 1/62* (2006.01)
(52) U.S. Cl. .................... 313/506; 313/504
(58) Field of Classification Search ......... 313/504–506, 313/512
See application file for complete search history.

(56) References Cited

U.S. PATENT DOCUMENTS 6,936,960 B2   8/2005  Cok

| 2001/0026124 A1 | 10/2001 | Liu et al. |
| 2003/0030055 A1 | 2/2003 | Nakano et al. |
| 2004/0189894 A1 | 9/2004 | Kim |
| 2004/0217381 A1 | 11/2004 | Park et al. |
| 2005/0073228 A1 | 4/2005 | Tyan et al. |

FOREIGN PATENT DOCUMENTS

| EP | 1406474 | 4/2004 |
| WO | WO 02/37580 | 5/2002 |

*Primary Examiner*—Vip Patel
(74) *Attorney, Agent, or Firm*—Stephen Shaw (57) ABSTRACT

An organic light-emitting diode (OLED) device, comprises: a first electrode and a second transparent electrode having one or more organic layers formed there-between, at least one organic layer being light-emitting; and a contrast enhancement element formed on a side of the second transparent electrode opposite the organic layers, wherein the contrast enhancement element comprises a patterned reflective layer for reflecting emitted light and a corresponding light-absorbing layer for absorbing ambient light, wherein the reflective layer is located between the light-absorbing layer and the second transparent electrode and wherein the corresponding layers form one or more transparent openings through the reflective and light-absorbing layers so that light emitted by the light-emitting organic layer passes through the transparent openings.

19 Claims, 11 Drawing Sheets

OLED DEVICE HAVING IMPROVED CONTRAST

FIELD OF THE INVENTION

The present invention relates to organic light-emitting diode (OLED) devices, and more particularly, to OLED device structures for improving light output and contrast.

BACKGROUND OF THE INVENTION

Organic light-emitting diodes (OLEDs) are a promising technology for flat-panel displays and area illumination lamps and backlights. However, OLED devices typically have a highly reflective back electrode to enhance the output of emitted light through one side of the OLED device. This highly reflective back electrode also reflects ambient light, thereby reducing the ambient contrast ratio of the OLED device. As is known in the prior art, circular polarizers can greatly reduce the reflected ambient light, but such circular polarizers are expensive.

Significant portions of emitted light may also be trapped in OLED devices. Scattering layers may be employed to improve the light emission of OLED devices, but may inhibit the effectiveness of circular polarizers, and do not selectively absorb ambient light. Chou (International Publication Number WO 02/37580 A1) and Liu et al. (U.S. Patent Application Publication No. 2001/0026124 A1), e.g., taught the use of a volume or surface scattering layer to improve light extraction. The scattering layer is applied next to the organic layers or on the outside surface of the glass substrate and has optical index that matches these layers. Light emitted from the OLED device at higher than critical angle that would have otherwise been trapped can penetrate into the scattering layer and be scattered out of the device. The light-emitting efficiency of the OLED device is thereby improved, but the ambient contrast is not significantly changed.

One prior-art approach to improving OLED device contrast is to employ a black matrix in all non-emitting areas of an OLED device, as described, for example in U.S. Pat. No. 6,936,960 entitled "OLED Displays having Improved Contrast" by Cok. The black matrix absorbs the fraction of ambient light incident upon the device between the light-emitting areas, without absorbing emitted light, thereby improving the contrast of the OLED. Generally, it is preferred to maximize the light-emitting area in an OLED device to reduce the current density in the light-emitting materials and extend the lifetime of the OLED. However, this reduces the amount of area available for a black matrix, thereby increasing the amount of ambient light reflected from the OLED back electrode and reducing the contrast of a top-emitting OLED device.

There is a need, therefore, for an improved organic light-emitting diode device structure that increases the ambient contrast of an OLED device.

SUMMARY OF THE INVENTION

In accordance with one embodiment, the invention is directed towards an organic light-emitting diode (OLED) device, comprising: a first electrode and a second transparent electrode having one or more organic layers formed therebetween, at least one organic layer being light-emitting; and a contrast enhancement element formed on a side of the second transparent electrode opposite the organic layers, wherein the contrast enhancement element comprises a patterned reflective layer for reflecting emitted light and a corresponding light-absorbing layer for absorbing ambient light, wherein the reflective layer is located between the light-absorbing layer and the second transparent electrode and wherein the corresponding layers form one or more transparent openings through the reflective and light-absorbing layers so that light emitted by the light-emitting organic layer passes through the transparent openings.

ADVANTAGES

The present invention has the advantage that it increases the ambient contrast of an OLED device.

It will be understood that the figures are not to scale since the individual layers are too thin and the thickness differences of various layers too great to permit depiction to scale.

DETAILED DESCRIPTION OF THE INVENTION

Figure 1:
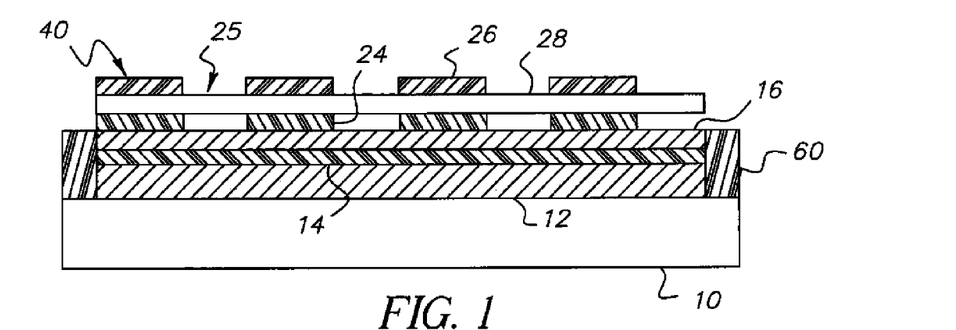
FIG. 1 illustrates a partial cross section of a top-emitter OLED device having a contrast enhancement element according to an embodiment of the present invention.

Referring to FIG. 1, in one embodiment of the present invention, an organic light-emitting diode OLED device comprises a first electrode 12 and a second transparent electrode 16 having one or more organic layers 14 formed there-between, at least one organic layer being light-emitting; and a contrast enhancement element 40 formed on a side of the second transparent electrode 16 opposite the organic layers 14, wherein the contrast enhancement element 40 comprises a patterned reflective layer 24 for reflecting emitted light and a corresponding light-absorbing layer 26 for absorbing ambient light, wherein the reflective layer 24 is located between the light-absorbing layer 26 and the second transparent electrode 16 and wherein the corresponding layers form one or more transparent openings 25 through the reflective and light-absorbing layers 24 and 26 so that light emitted by the light-emitting organic layers 14 passes through the transparent openings 25. Due to the presence of the patterned reflective layer 24 and corresponding light-absorbing layer 26, openings 25 through contrast enhancement element 40 are relatively transparent compared to non-opening areas of element 40, so as to preferentially pass light through such openings. Reflective edges 60 may be employed to prevent light escaping from the light-emitting area defined by the electrodes. In the top-emitting embodiment of FIG. 1, the OLED electrodes 12 and 16 and organic layers 14 are located between a substrate 10 and the contrast enhancement element 40. As is also illustrated in FIG. 1, reflective layer 24 and light-absorbing layer 26 may be patterned on a film 28, where the film 28 is transparent so that light emitted by the light-emitting organic layers 14 passes through the transparent openings 25 in layers 24 and 26. Alternatively, light absorbing layer 26 may be located directly on reflective layer 24. First electrode 12 is preferably a reflective electrode, to optimize emitted light output through transparent second electrode 16.

Figure 2:
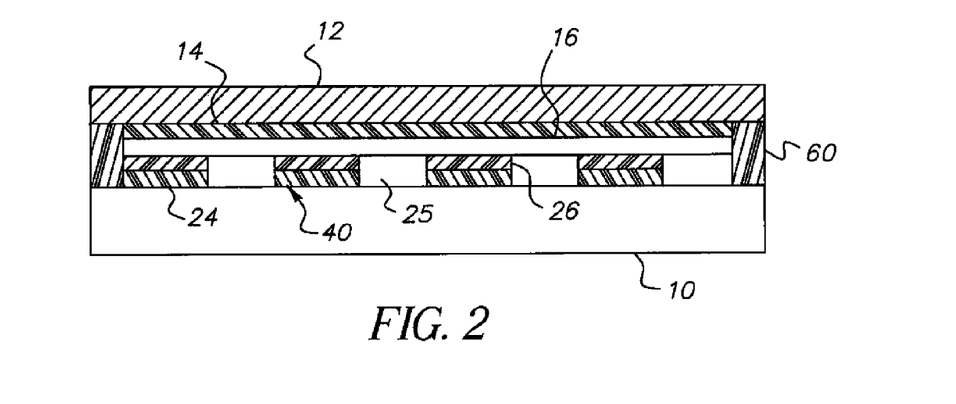
FIG. 2 illustrates a partial cross section of a bottom-emitter OLED device having a contrast enhancement element according to an alternative embodiment of the present invention.

Referring to FIG. 2, an alternative embodiment of the present invention employs a bottom-emitting structure. In this embodiment, the contrast enhancement element 40 is located between OLED transparent electrode 16 and the substrate 10. Note that the relative positions of first electrode 12 and transparent second electrode 16 are reversed with respect to substrate 10 in such bottom-emitting embodiment. In other embodiments, the contrast enhancement element 40 may be located on the outside or inside of a cover of a top-emitting OLED device or on the outside of the substrate of a bottom-emitting OLED device (not shown).

Figure 3:
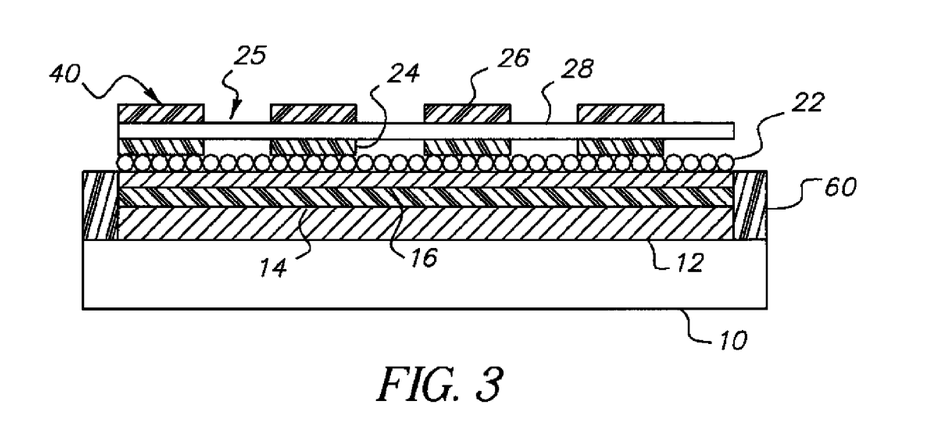
FIG. 3 illustrates a partial cross section of a top-emitter OLED device having a contrast enhancement element and an adjacent scattering layer according to yet another embodiment of the present invention.
Figure 4:
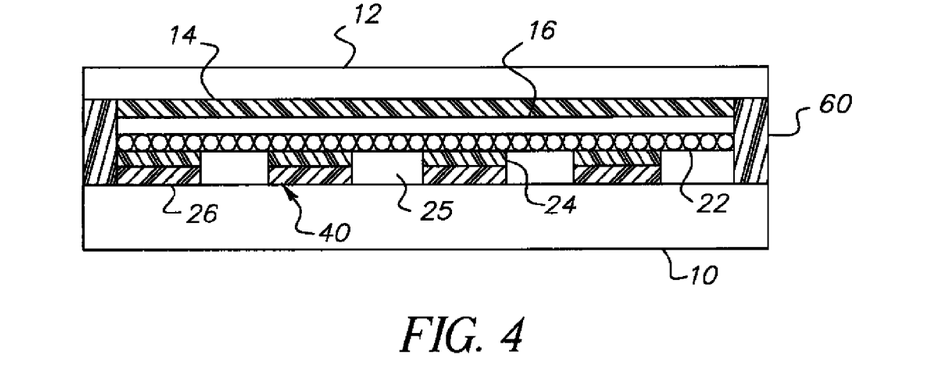
FIG. 4 illustrates a partial cross section of a bottom-emitter OLED device having a contrast enhancement element and an adjacent scattering layer according to an alternative embodiment of the present invention.
Figure 5:
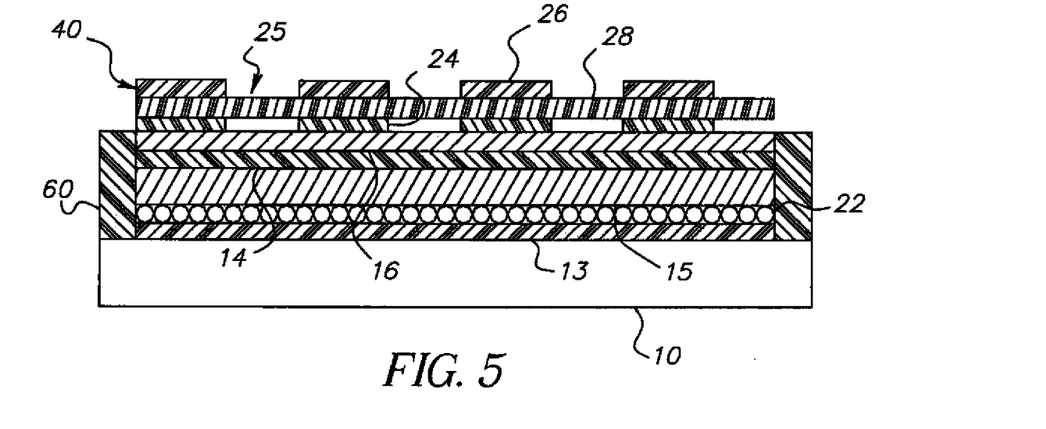
FIG. 5 illustrates a partial cross section of a top-emitter OLED device having a contrast enhancement element located opposite a scattering layer according to an alternative embodiment of the present invention.

Referring to FIGS. 3 and 4, in further top- and bottom-emitter embodiments of the present invention, a scattering layer 22 is employed to increase the light output of the OLED device. As described in co-pending, commonly assigned U.S. Ser. No. 11/065,082, filed Feb. 24, 2005, the disclosure of which is hereby incorporated by reference, light emitted by the organic layers of an OLED may be trapped within the OLED device and a scattering layer may be employed to scatter the trapped light out of the OLED device. In the embodiments of FIGS. 3 and 4, the scattering layer 22 is located between the second transparent electrode 16 and the contrast enhancement element 40. In an alternative embodiment shown in FIG. 5 (for a top-emitter), the electrodes and the organic layers may be located between the contrast enhancement element 40 and the scattering layer 22. In this embodiment, the first electrode 12 comprises multiple layers including a transparent layer and a reflective layer. As shown in FIG. 5, the scattering layer 22 is provided between a transparent electrode 15 and a reflective layer 13 to scatter and reflect light emitted by the organic layers. In various other embodiments, the reflective layer 15 may itself comprise a scattering surface.

Figure 6:
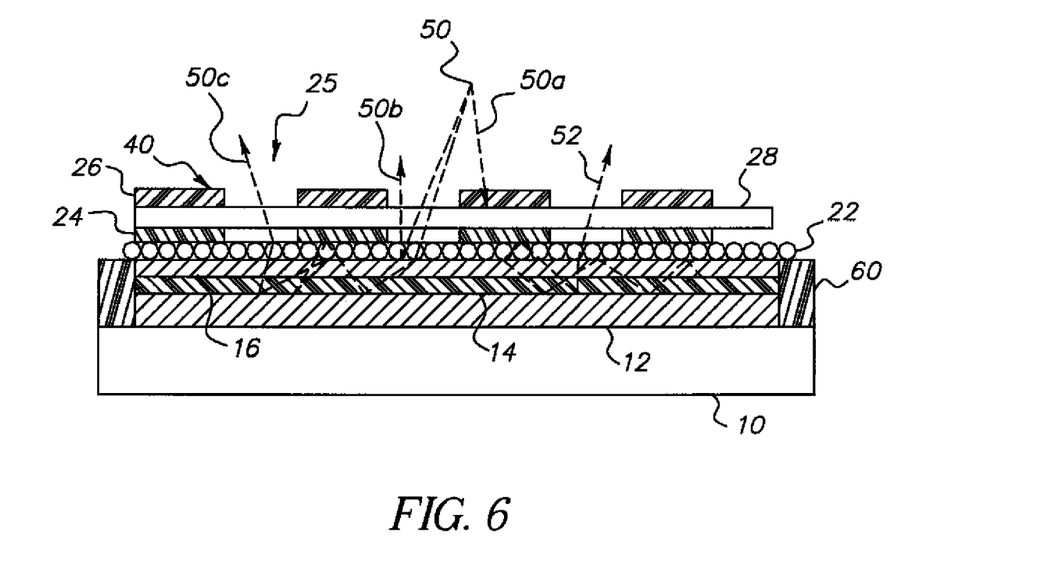
FIG. 6 illustrates light rays traveling through a partial cross section of the top-emitter OLED device of FIG. 3.

Referring to FIG. 6, in operation light 52 emitted by the organic layers 14 may be emitted from the OLED device through the relatively transparent openings 25 in the contrast enhancement element 40. Light that is not emitted toward an opening 25 will be reflected from the reflective portion 24 of the contrast enhancement element 40 and a reflective first electrode 12 until the light is emitted through a transparent opening 25 and is transmitted out of the OLED device. If a scattering layer 22 is employed (as shown), the light rays' directions will be altered each time a light ray encounters the scattering layer 22 until the light ray passes through an opening. It is possible that a light ray 52 may reflect between the scattering layer 22 and the reflective portion without encountering first electrode 12.

Ambient light 50 that is incident on the contrast enhancement element 40 will either be absorbed 50a by the light-absorbing portion 26 of the contrast enhancement element 40 or pass into the OLED and encounter the scattering layer 22 (if present) and/or the first electrode 12. The light 50b and 50c that passes into the OLED will eventually be reflected back out in a similar manner to the emitted light and will reduce the contrast of the OLED device. However, by decreasing the relative area of the openings 25 with respect to the total area of the contrast enhancement element 40, the contrast of the OLED device can be increased. The physical limit of the contrast improvement possible by employing the contrast enhancement element 40 according to the present invention will then be limited by the actual absorption of light in the material layers 14 in the OLED and by losses due to imperfect reflection by a reflective first electrode 12 or the reflective portions 24 of the contrast enhancement element 40. These absorption and imperfect reflections will also reduce the amount of emitted light that passes out of the OLED device. According to the present invention, the light-absorbing layer 26 or surface will improve the ambient contrast of the OLED device in direct ratio to the light-absorbing percentage of the area of the contrast enhancement element 40.

Figure 16:
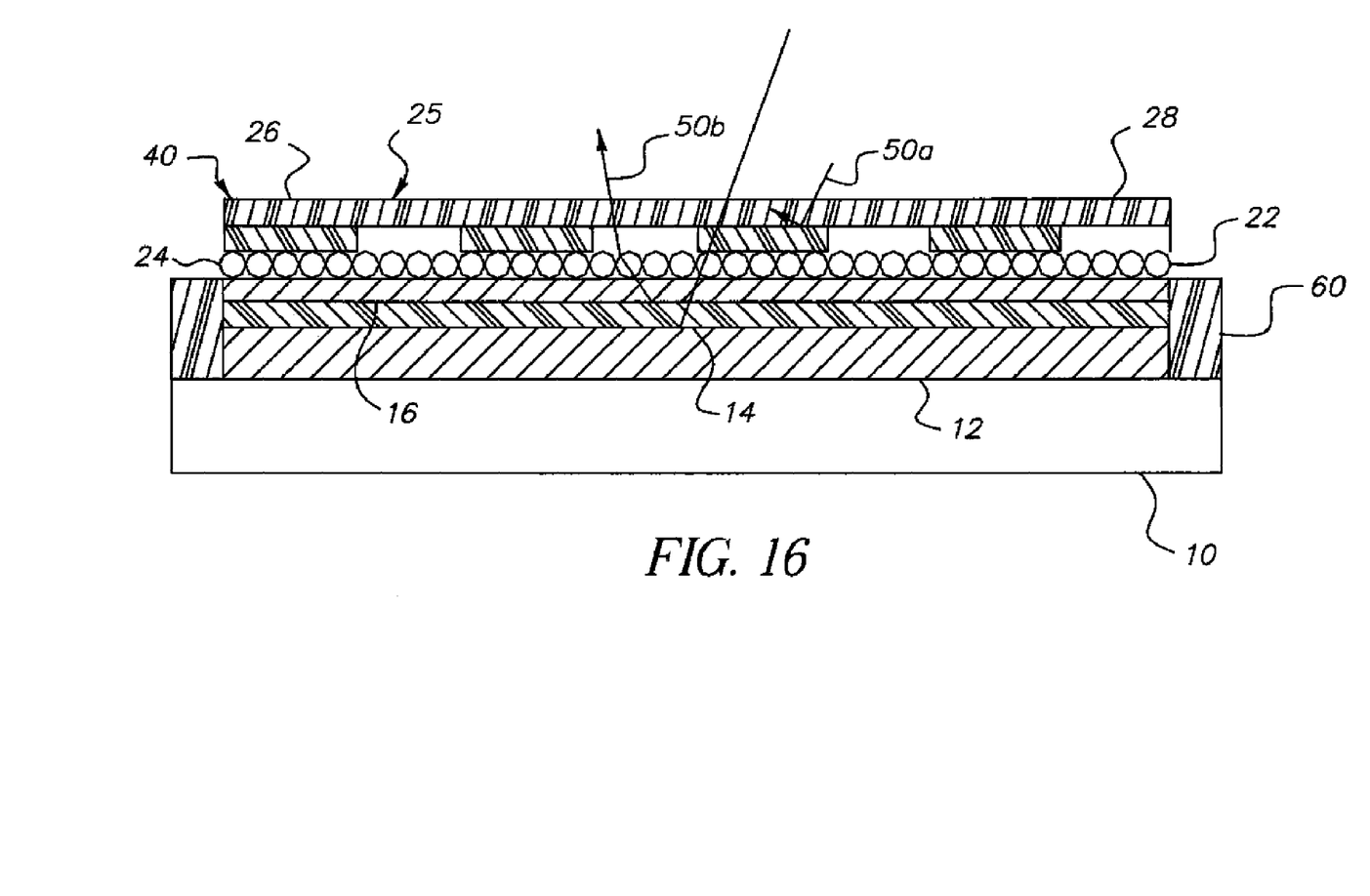
FIG. 16 illustrates a partial cross section of a top-emitter OLED device having a contrast enhancement element comprising a circular polarizer according to yet another embodiment of the present invention.

While a non-polarizing-dependent light-absorbing material may preferably be employed for layer 26 in a pattern corresponding to that of patterned reflective layer 24 (such as a black matrix employing carbon black), an unpatterned circular polarizer may also be employed as the corresponding light-absorbing layer 26 to relatively selectively absorb ambient light when used in combination with a patterned reflective layer 24 having a polarizing-preserving reflective surface. Referring to FIG. 16, light absorbing layer 26 is a circular polarizer located over patterned reflective layer 24. Some ambient light 50a is first polarized, and then reflected from layer 24 and effectively absorbed (e.g., 99% absorbed) in layer 26. Ambient light passing a first time through the transparent openings will also be polarized, but such polarization will be disturbed by scattering layer 22 such that reflected ambient light will not be totally absorbed upon passing through the openings 25 a second time. Such reflected ambient light will be repolarized, however, thereby further absorbing the ambient light. Emitted light will also pass through the transparent openings 25. As such emitted light will only pass through openings 25 once, however, only approximately half of such light will be absorbed, and the circular polarizer in combination with a patterned reflective layer thus effectively selectively absorbs ambient light so that ambient contrast may be improved. In a further alternative embodiment, layer 26 may comprise a patterned circular polarizer.

In any practical implementation for a useful OLED device, there must be at least one opening in the contrast enhancement element for each light emitting area. Hence, the minimum number of openings and the maximum spacing of the openings are defined by the OLED device. In general, it is useful to have several transparent openings 25 per light-emitting area or pixel. For example, an OLED device might have a plurality of light-emitting areas defined by a patterned electrode of 50 microns by 200 microns and separated by a 20 micron gap. In such case, the contrast enhancement element preferably will have openings 25 that are centered apart by at most 50 microns in one dimension and 200 microns in a second dimension and preferably less than half that to avoid the openings 25 falling between the light-emitting areas. The size and shape of the openings are not critical and may be determined by practical limitations in the manufacture of the contrast enhancement element. Since light may be absorbed by the organic layers 14 or imperfectly reflected from a reflective first electrode 12 or reflective portion of layer 24, it is preferred that many openings be provided for each light-emitting area. For example, it may be preferred to provide 10 micron-diameter openings on 20-micron centers to provide an approximately 80% black matrix fill factor. Alternatively, it may be preferred to provide 6 micron-diameter openings on 12-micron centers to provide a similar black matrix fill factor. The more frequently spaced openings may decrease emitted light absorption. Applicants have constructed a contrast enhancement element with an approximately 80% lack matrix fill factor that demonstrated an improved ambient contrast ratio when used with an OLED device.

The contrast enhancement element 40 can be formed directly on the OLED device for example on or adjacent to the substrate 10, a cover, or on an electrode or any protective layers formed on the electrode using techniques such as photolithography or thick film printing. In this case, the contrast enhancement element 40 effectively comprises two layers, the reflective material 24 and the light-absorbing material 26, formed over the OLED device. Alternatively, the contrast enhancement element 40 can be formed separately and applied to the OLED after each is manufactured. In the latter case, the contrast enhancement element 40 may be formed in or on a transparent film 28 with patterned transparent and light-absorbing coatings on either side or surface of the film and holes or transparent areas in the film providing the openings. Suitable film materials are known in the art, for example polyethylene teraphthalate (PET). If the contrast enhancement element 40 has sufficient openings 25, the film need not be aligned to the OLED device. The contrast enhancement element 40, particularly if formed as a separate film, may be in contact with both the cover and the top layer of the OLED device. In this way, a solid-state structure having excellent mechanical stability may be formed.

Figure 7A:
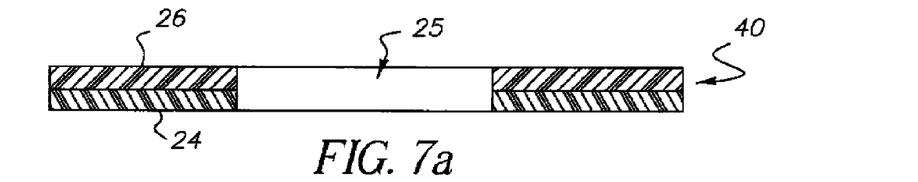
FIGS. 7a-e are side views of various embodiments of contrast enhancement elements according to alternative embodiments of the present invention.
Figure 7B:
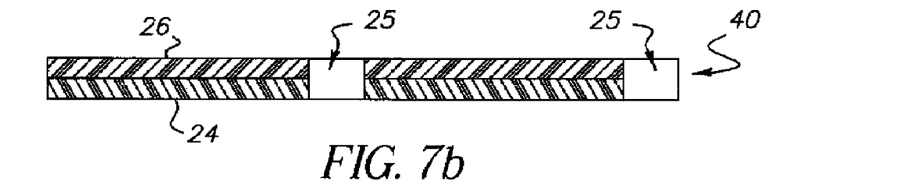
Figure 7C:
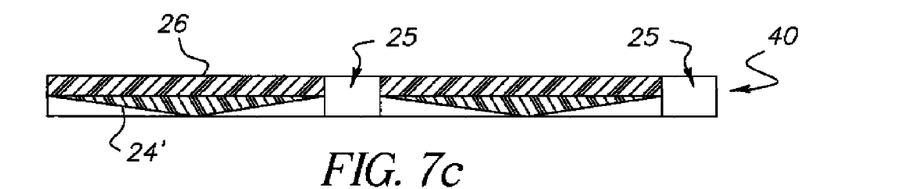
Figure 7D:
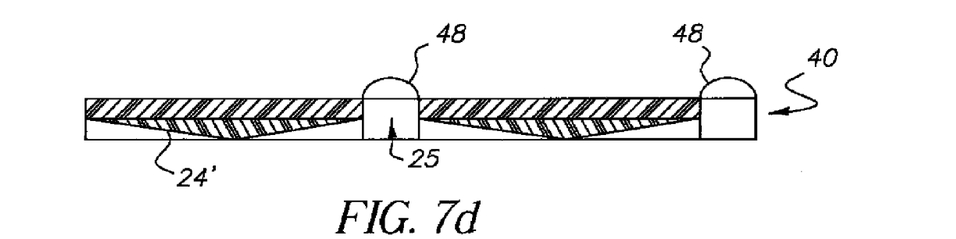
Figure 7E:
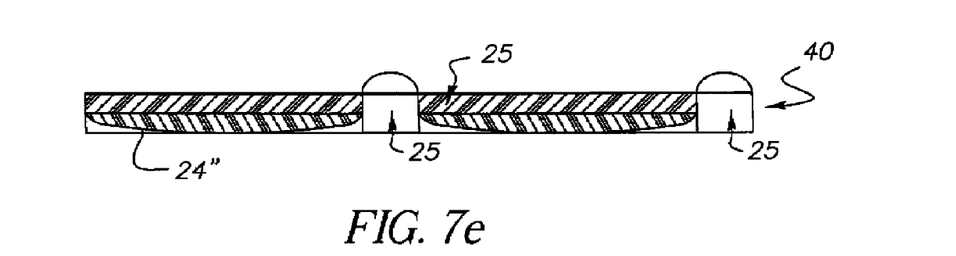

To enhance the performance of the contrast enhancement element, it may be possible to structure the reflective portions 24. For example, referring to FIGS. 7a-e, FIG. 7a illustrates a contrast enhancement element 40 having reflective layer 24 and light-absorbing layer 26 planar coatings. FIG. 7b illustrates a contrast enhancement element 40 with a reduced fill factor and improved contrast. In FIG. 7c, the reflective portion 24' of the contrast enhancement element 40 may be angled with respect to the plane of the element 40 (and the corresponding OLED reflective electrode), thereby improving the likelihood that a light ray will encounter an opening 25 rather than being reflected again. Likewise, it is possible to provide angular, segmented structures in the OLED reflective electrode and at the edges of light-emitting areas to improve the likelihood that a light ray will travel through a transparent opening 25 and reduce the likelihood that a light ray will be absorbed within the OLED device. Referring to FIG. 7d, lenslets 48 may also be employed over the transparent openings 25 to further enhance the optical performance of the present invention. Referring to FIG. 7e, it is possible to provide curved structures in the reflective portion 24" to further enhance the optical performance of the present invention.

Figure 8:
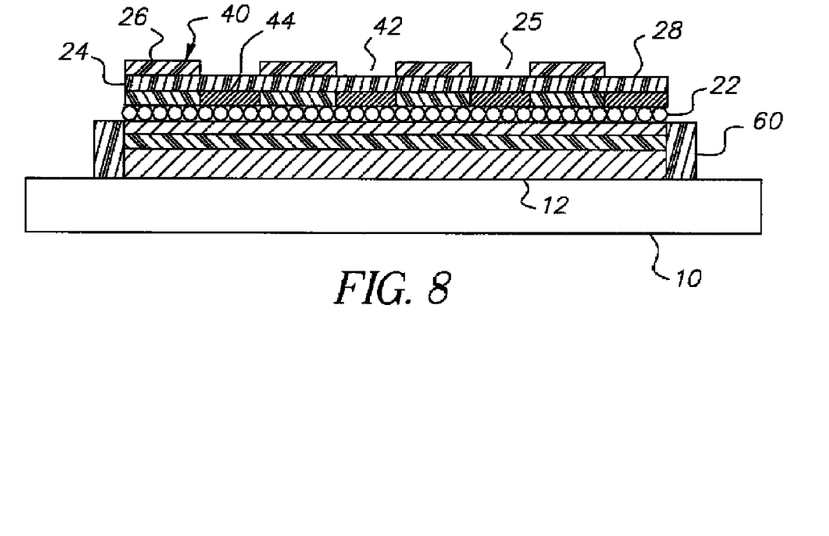
FIG. 8 illustrates the use of individual color filters in combination with the partial cross section of the top-emitter OLED device of FIG. 3 as an alternative embodiment of the present invention.

Referring to FIG. 8, in further embodiments of the present invention, a color filter 44 may be located in the transparent opening 25 to filter the light output from the OLED device. The OLED organic layers 14 may either emit a colored light or a broadband (primarily white) light and the color filter may be employed to provide an appropriate color of light, for example to provide a full-color OLED display. In various embodiments, the color filter 44 may be located on the OLED above or below the scattering layer, in or on the contrast enhancement element 40, or formed on the cover or substrate of a top-emitting or bottom-emitting OLED device, respectively. Color filters are known in the art and may include, for example, pigments or dyes formed in or on a base material, for example film or various protective layers such as glass, silicon or silicon-based materials, polymers, or metal oxides. The color filters may be formed in a layer and a variety of colors provided in different locations in the layer.

Figure 9:
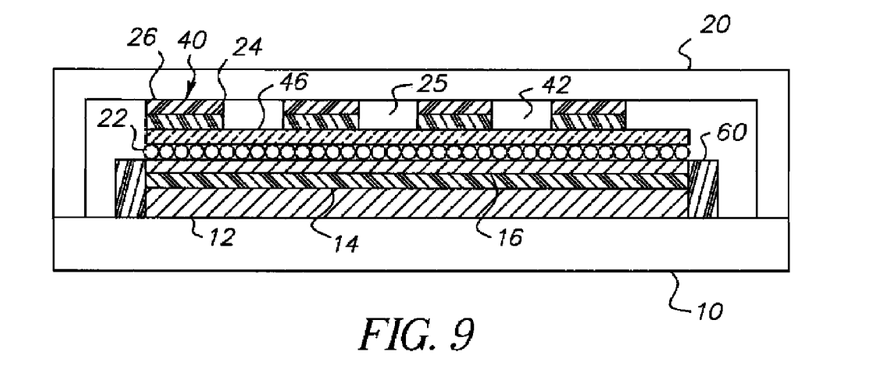
FIG. 9 illustrates the use of a color filter layer in combination with the partial cross section of the top-emitter OLED device of FIG. 3 as yet another alternative embodiment of the present invention.

Alternatively, referring to FIG. 9, a color filter layer 46 may be located over the entire extent of the OLED light-emitting area under the contrast enhancement element 40. The color filter layer 46 may be formed on a scattering layer, if present (as shown in FIG. 9), or on a transparent electrode or any protective or encapsulating layers formed on a transparent electrode or formed on the cover or substrate of a top-emitting or bottom-emitting OLED device, respectively (not shown). The color filter layer 46 may be located between the scattering layer 22 and the contrast enhancement element 40. In this case, both emitted and ambient light that is reflected within the OLED device may pass through the filter multiple times.

The color filters may be deposited directly on the OLED device or may be formed on the OLED device as part of the contrast enhancement element 40, or may be incorporated into a separate contrast enhancement film 28 as shown in FIG. 8. In this last case, the contrast enhancement film must be aligned to the light-emitting areas to form a full-color device with colored pixels. Color filters, black-matrix materials, and reflective coatings are all known in the art.

A transparent low-index element (possibly an air gap) having a refractive index lower than the refractive index of an encapsulating cover or substrate through which light is emitted from the OLED device and lower than the refractive index range of the OLED element materials may be employed between the transparent electrode 16 and the substrate or cover in combination with a scattering layer to improve the sharpness of the OLED device, as is disclosed in co-pending, commonly assigned U.S. Ser. No. 11/065,082, filed Feb. 24, 2005, the disclosure of which is hereby incorporated by reference. In accordance with the present invention, such a low-index layer may be incorporated into the contrast enhancement element 40. The openings in the contrast enhancement element, e.g., may form a low-index element having a refractive index lower than the refractive index range of the organic layers and of the substrate or cover through which light is emitted. In this embodiment, the low-index element is between the scattering layer and the substrate or cover through which light is emitted.

Figure 10A:
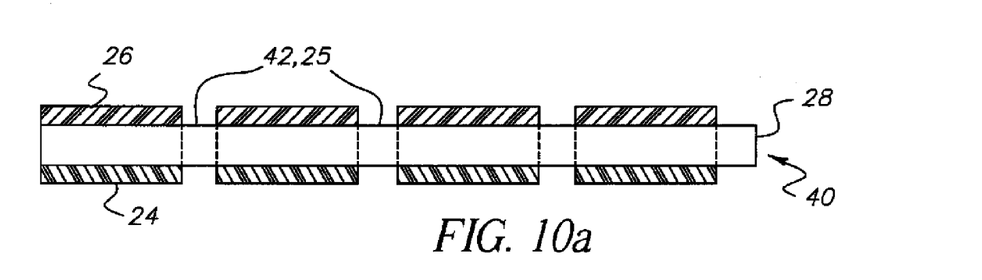
FIGS. 10a-d are side views of various embodiments of a contrast enhancement film according to alternative embodiments of the present invention.
Figure 10B:
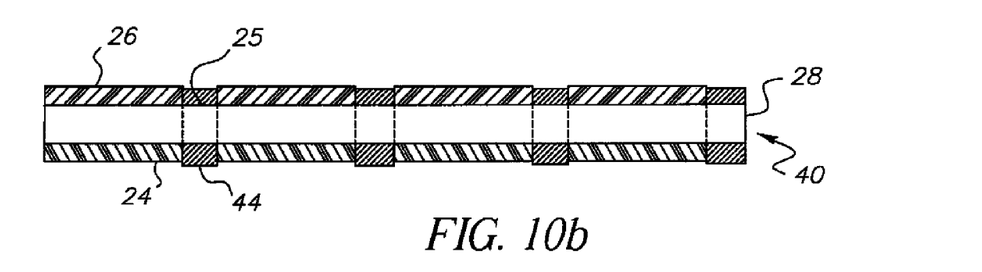
Figure 10C:
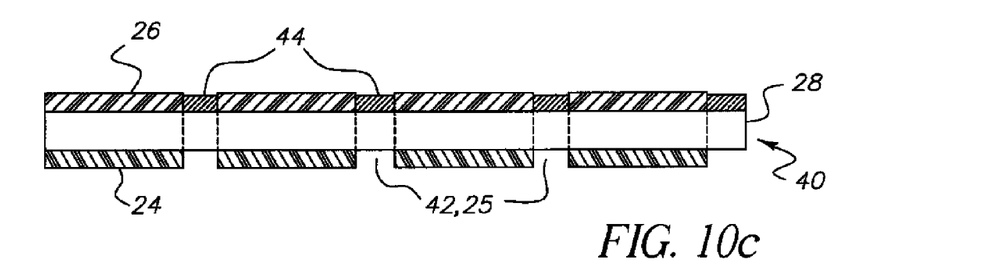
Figure 10D:
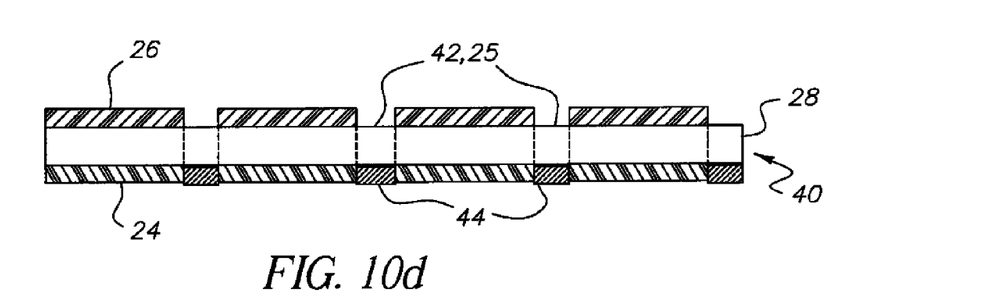

If the opening in the contrast enhancement element 40 is not a transparent polymer or glass, for example, but is filled with a gas or vacuum, the gas or vacuum will provide a low-index layer useful in preserving the sharpness of a multi-pixel OLED device. Hence, a transparent opening 25 in the contrast enhancement film 40 may serve as a low-index layer. Referring to FIG. 10a, a contrast enhancement element 40 may comprise a film 28 with openings 25 between which are formed reflective layers 24 on one side of the film 28 and light-absorbing layers 26 on the other side of the film. In the embodiments of FIG. 10a, the openings 25 are actually physical holes in the film 28 (shown by dotted lines) where there is an absence of solid material. The holes may be filled with air or an inert gas, such as nitrogen or argon, to form a low-index layer 42. In alternative embodiments, the transparent openings 25 may comprise transparent portions of the film 28. In such embodiment, openings in the layers 24 and/or 26 may themselves be sufficient to provide a low-index gap. Referring to FIG. 10b, the openings 25 may be partially or completely filled with a color filter 44. (If the openings 25 are completely filled, they may not provide a low-index layer 42.) Alternatively, referring to FIGS. 10c and 10d, the top side (FIG. 10c) or the bottom side (FIG. 10d) only of openings 25 may be filled with a color filter 44.

Since the low-index element has an optical index lower than that of the OLED elements and the cover or substrate through which light is emitted, any light that is scattered into the low-index layer 42 by the scattering layer will pass through the layer and the cover or substrate, since light passing from a low-index material (the layer 42) into a higher index material (the cover or substrate) cannot experience total internal reflection.

Figure 11:
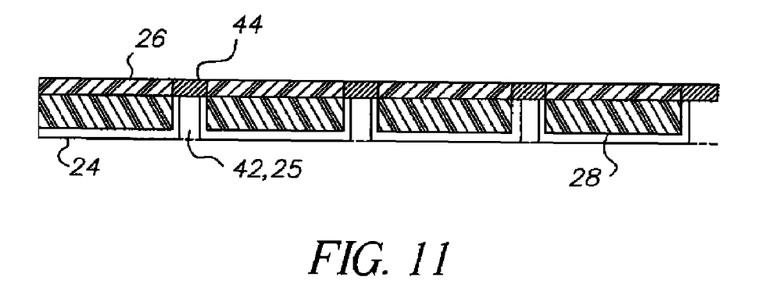
FIG. 11 illustrates reflective holes and color filters in a contrast enhancement film according to an embodiment of the present invention.

In order to improve the performance of the contrast enhancement element, it is useful to prevent OLED-emitted light from traveling into the contrast enhancement element. Referring to FIG. 11, reflective material 24 is provided on the edges of holes in film 28 as well as on the surface of the film to form openings 25 in the contrast enhancement element. Light that travels at an angle into the openings 25 cannot pass into the material of the film 28 but are reflected out of the contrast enhancement element and through a color filter 44 (if present).

Figure 14A:
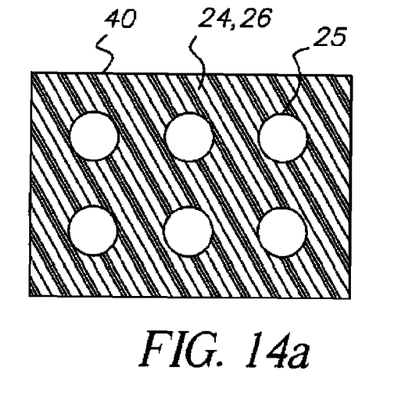
FIGS. 14a-d are top views of various embodiments of a contrast enhancement element according to alternative embodiments of the present invention.
Figure 14B:
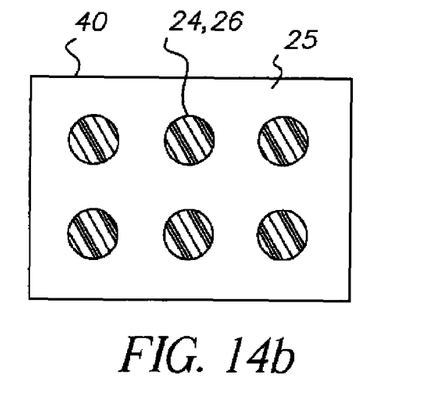
Figure 14C:
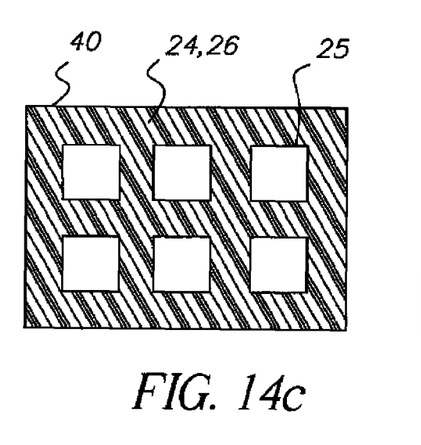
Figure 14D:
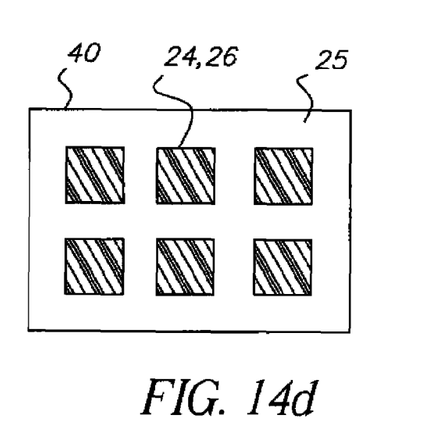

Referring to FIGS. 14a-d, the patterning of a contrast enhancement element 40 according to various embodiments of the present invention is shown. In FIG. 14a, an array of circular holes forming transparent openings 25 are formed in a film having a reflective layer 24 on one side and a light-absorbing layer 26 on the other side. Alternatively, as shown in FIG. 14b, layers 24 and 26 may be formed as circular islands surrounded by transparent opening 25. In the embodiment of FIG. 14a, the contrast enhancement element 40 may readily be formed from a film with holes while in FIG. 14b the film may include transparent openings but not physical holes to provide physical support to the reflective and light-absorbing layers. Alternatively, the reflective and light-absorbing layers may not be formed in a film but constructed, for example, using photolithography. A wide variety of shapes may be employed in various embodiments of the present inventions, for example as shown in FIGS. 14c and 14d, rectangular areas may be employed rather than circular areas.

Figure 15A:
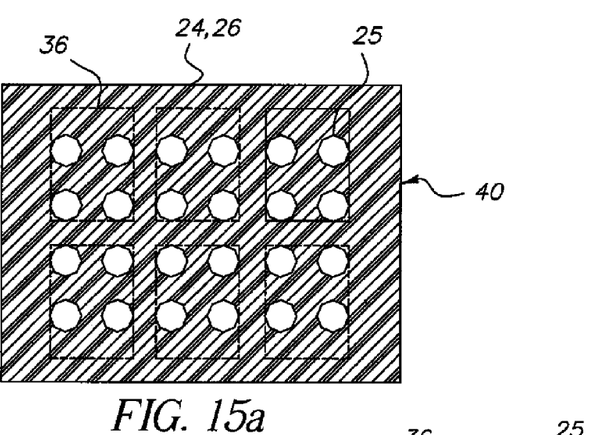
FIGS. 15a-c are top views of various embodiments of a contrast enhancement element over multiple, separate light-emissive areas according to alternative embodiments of the present invention.
Figure 15B:
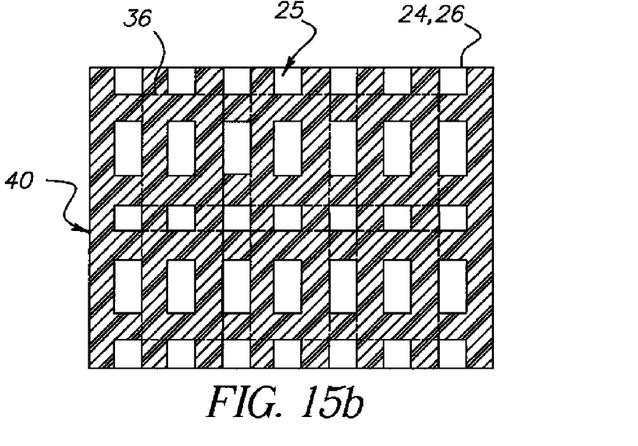
Figure 15C:
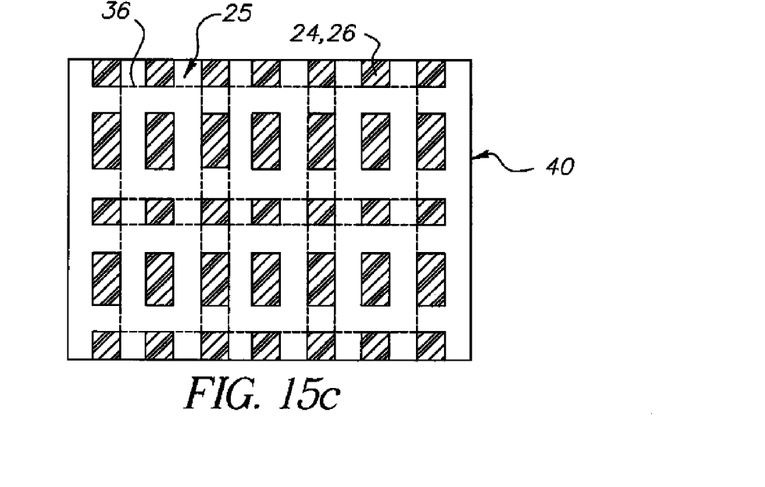

Referring to FIGS. 15a and b, at least one but preferably a plurality of transparent openings 25 are located over light-emitting areas 36 of an OLED device. As noted with respect to FIGS. 14a-d and illustrated in FIGS. 15a-c, a wide variety of shapes, layout, and relative sizes may be employed. In FIG. 15a, circular transparent openings 25 are surrounded by aligned reflective and light-absorbing layers 24 and 26 and located over light-emissive areas 36. In FIG. 15b, rectangular transparent openings 25 are surrounded by aligned reflective and light-absorbing layers 24 and 26 located at the periphery of light-emissive areas 36. A single central transparent opening 25 is then formed at the center of the light-emitting area 36. While additional openings are depicted between light-emissive areas, such additional openings may or may not be employed in various embodiments. FIG. 15c is the reverse of FIG. 15b, in which the aligned reflective and light-absorbing layers 24 and 26 are located at the center of the light-emissive area 36.

When employed, the scattering layer 22 should be in optical contact with the light emitters in order to effectively enhance the light output of the OLED device. By optical contact is meant that there are no intervening layers having an optical index lower than the optical index of any of the organic and transparent electrode layers and that light that passes through any one of the layers will encounter the scattering layer. The one or more organic layers may include one or more of the following layers: a hole-injection layer, hole-transport layer, electron-injection layer, electron-transport layer, and a light-emitting layer. More than one light-emitting layer may be employed in the present invention, for example to create a white light output. These layers are well known in the OLED art. Although OLED layer structures are more typically described with a cathode on the top and an anode on the bottom near the substrate, it is well known that the organic layers can be inverted and the positions of the anode and cathode exchanged. Such inverted structures are included in the present invention.

In preferred embodiments, the contrast enhancement element is partially, largely, or completely co-extensive with either the first or second transparent electrodes to maximize the contrast and light output of the OLED device.

Various conductive and scattering materials useful in the present invention, as well as the employment of scattering layers for extracting additional light from the device are described in more detail in co-pending, commonly assigned U.S. Ser. No. 11/065,082, filed Feb. 24, 2005, the disclosure of which is incorporated by reference above. Additional layers may be usefully employed with the present invention. For example, one problem that may be encountered with scattering layers is that the organics may not prevent the electrodes from shorting near the sharp edges associated with the scattering elements in the layer 22. Although the scattering layer may be planarized, typically such planarizing operations do not form a perfectly smooth, defect-free surface. To reduce the possibility of shorts between the electrodes, a short-reduction layer (not shown) may be employed between an electrode and the organic layers, when the electrode is formed over the scattering layer. Such a layer is a thin layer of high-resistance material (for example having a through-thickness resistivity between $10^{-7}$ ohm-cm$^2$ to $10^3$ ohm-cm$^2$). Because the short-reduction layer is very thin, device current can pass between the electrodes through the device layers but leakage current through the shorts are much reduced. Such layers are described in co-pending, commonly assigned U.S. Ser. No. 10/822,517, filed Apr. 12, 2004, the disclosure of which is incorporated herein by reference.

Figure 12:
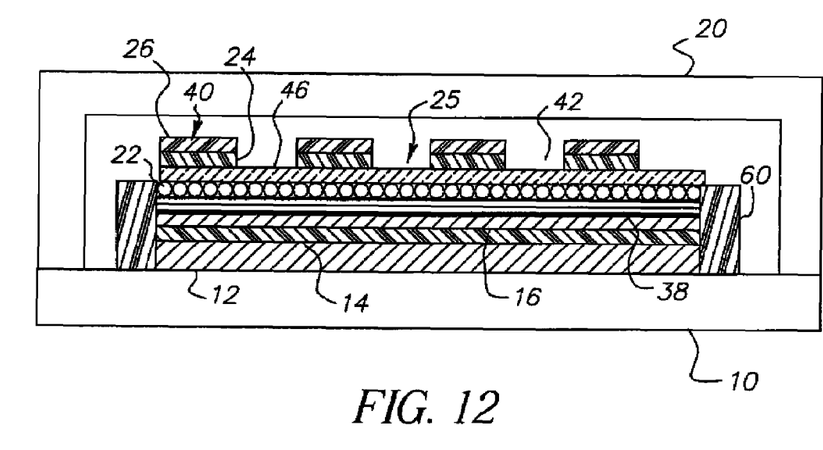
FIG. 12 illustrates a partial cross section of a top-emitter OLED device having a contrast enhancement element, an adjacent scattering layer, and a protective layer according to an alternative embodiment of the present invention.

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890 issued May 8, 2001 to Boroson et al. In addition, barrier layers such as $SiO_x$ (x>1), Teflon, and alternating inorganic/polymeric layers are known in the art for encapsulation. Atomic layer deposition may be employed to provide encapsulation, for example as described in copending, commonly assigned U.S. Ser. No. 11/122,295, filed Apr. 5, 2005, the disclosure of which is incorporated by reference herein. These encapsulation layers may be formed over the transparent electrode either under or over any of the scattering layers, color filter layers, or contrast enhancement elements. Referring to FIG. 12, a protective layer 38, for example an encapsulating layer formed by atomic layer deposition and/or a layer of parylene, is formed over the transparent electrode 16.

Figure 13:
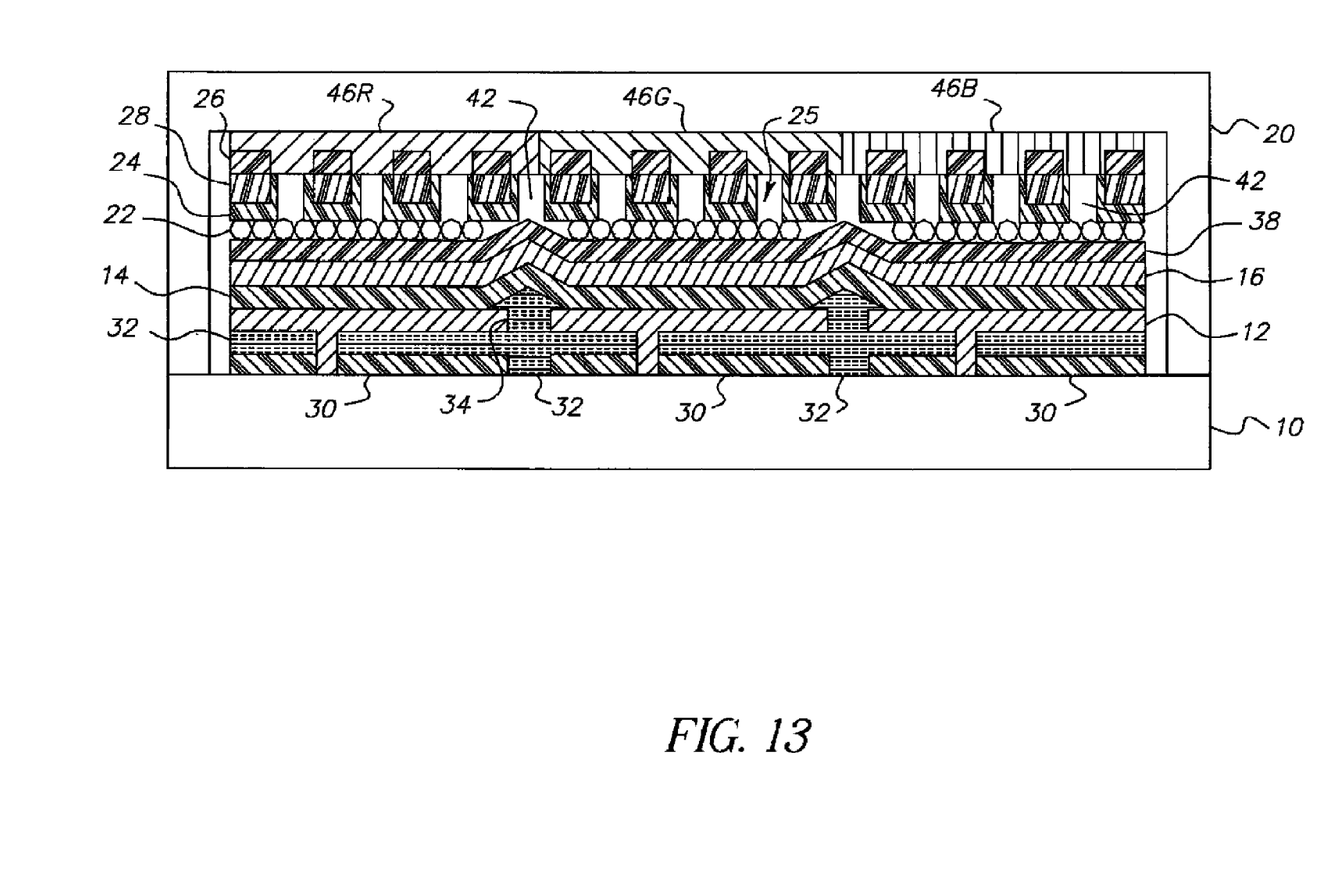
FIG. 13 illustrates a cross section of a top-emitter OLED device according to an alternative embodiment of the present invention.

The present invention is useful in improving the performance of an active-matrix OLED device employing patterned electrodes to control light emission from a plurality of light-emitting pixel areas. Referring to FIG. 13, a top-emitting pixilated OLED device according to an embodiment of the present invention is illustrated having a substrate 10 (either reflective, transparent, or opaque). Over the substrate 10, a semiconducting layer is formed providing thin-film electronic components 30 for driving an OLED. An interlayer insulating and planarizing layer 32 is formed over the thin-film electronic components 30 and a first patterned reflective metal electrode 12 defining OLED light-emissive pixels is formed over the insulating layer 32. An inter-pixel insulating film 34 separates the elements of the patterned reflective metal electrode 12. One or more first layers 14 of organic materials described above, one or more of which together emits broadband light, are formed over the patterned reflective metal electrode 12. A transparent second electrode 16 is formed over the one or more first layers 14 of organic material. The first reflective electrode 12 may instead be at least partially transparent and/or light absorbing. Typically, the reflective metal electrode 12 comprises Al, Ag, Mg, or alloys of these or other reflective metals. The transparent electrode 16 may comprise ITO or other transparent and conductive metal oxides.

A protective layer 38, for example comprising aluminum oxide and/or parylene, is formed over the transparent electrode 16, for example by atomic deposition and/or spray coating. A scattering layer 22 is formed over the protective layer 38, for example by spray coating. A contrast enhancement element formed separately and having a plurality of holes 25 located through film 28 on center spacing smaller than the size of the pixel defined by patterned electrodes 12 is coated on one side by a reflective layer 24 of material, for example evaporated aluminum. The reflective layer 24 may also coat the insides of the holes. The other side of the film 28, except in the holes forming a low-index gap 42, is coated with a light-absorbing layer 26 comprising, for example carbon black. A patterned layer of color filters 46R, 46G, and 46B (for example red, green, and blue) is formed over and between the light-absorbing layer 26. The separately formed contrast enhancement element formed in a film 28 is than aligned with the patterned electrodes 12 and affixed to the OLED over the scattering layer 22. A cover 20 may be placed over and in contact with the contrast enhancement film or an additional gap (possibly a low-index gap) may be located between the contrast enhancement film 28 and the inside surface of the cover 20. The color filters 46 may alternatively be located on the cover 20, so that the contrast enhancement film 28 does not need to be aligned with the patterned electrodes 12 (but the cover 20 must then be aligned).

The present invention may also be employed with four-sub-pixel display designs for example, having a red, green, blue, and white emitter. A neutral density filter may be located over any of the emitters, but in particular may be employed with a white emitter to improve device contrast. Such color or neutral density filters may be located in any of the locations taught herein. In various embodiments, the organic layers may emit color light so that the color filters are unnecessary. The color filters may be located above or below the cover, contrast enhancement element, or scattering layer.

OLED devices of this invention can employ various well-known optical effects in order to enhance their properties if desired. This includes optimizing layer thicknesses to yield maximum light transmission, providing dielectric mirror structures, providing anti-glare or anti-reflection coatings over the display, providing a polarizing medium over the display, or providing colored, neutral density, or color conversion filters over the display. Filters, polarizers, and anti-glare or anti-reflection coatings may be specifically provided over or as part of the cover or substrate.

The present invention may be practiced with either active- or passive-matrix OLED devices, and is particularly useful in display devices. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active- and passive-matrix OLED displays having either a top- or bottom-emitter architecture.

The invention has been described in detail with particular reference to certain preferred embodiments thereof, but it will be understood that variations and modifications can be effected within the spirit and scope of the invention.

PARTS LIST 10 substrate
12 reflective electrode
13 reflective layer
14 organic layer(s)
15 transparent electrode
16 transparent electrode
20 cover
22 scattering layer
24, 24', 24" reflective layer
25 transparent opening portion
26 light-absorbing layer
28 film
30 thin-film circuitry
32 insulator
34 insulator
36 light-emissive area
38 protective layer
40 contrast enhancement element
42 transparent low-index element
44 color filter
46 color filter
46R, 46G, 46B color filters
48 lenslet
50, 50a, 50b, 50c ambient light rays
52 emitted light ray
60 reflective edge

The invention claimed is:
1. An organic light-emitting diode (OLED) device comprising:

a first electrode and a second transparent electrode having one or more organic layers formed there-between, at least one organic layer being light-emitting; and a contrast enhancement element formed on a side of the second transparent electrode opposite the organic layers, wherein the contrast enhancement element comprises a patterned reflective layer for reflecting emitted light and a corresponding lift-absorbing layer for absorbing ambient light, wherein the patterned reflective layer is located between the light-absorbing layer and the second transparent electrode and wherein the corresponding layers form one or more transparent openings though the reflective and light-absorbing layers so that light emitted by the light-emitting organic layer passes through the transparent openings, and wherein the one or more transparent openings through the reflective and light-absorbing patterned layers include holes.

2. The organic light-emitting diode (OLED) device of claim 1, further comprising a substrate wherein the first and second electrodes and organic layers are located between the substrate and the contrast enhancement element.

3. The organic light-emitting diode (OLED) device of claim 1, further comprising a substrate wherein the contrast enhancement element is located between the substrate and the second electrode.

4. The organic light-emitting diode (OLED) device of claim 1, further comprising a scattering layer located between the contrast enhancement element and the second electrode.

5. The organic light-emitting diode (OLED) device of claim 1, further comprising a scattering layer and wherein the first and second electrodes and organic layers are located between the contrast enhancement element and the scattering layer.

6. The organic light-emitting diode (OLED) device of claim 1, further comprising one or more color filters located on either side of the contrast enhancement element or in at least one of the openings.

7. The organic light-emitting diode (OLED) device of claim 1, further comprising a layer of color filters located between the second electrode and the contrast enhancement element.

8. The organic light-emitting diode (OLED) device of claim 1, further comprising a scattering layer and a layer of color filters and wherein the layer of color filters are located between the scattering layer and the contrast enhancement element.

9. The organic light-emitting diode (OLED) device of claim 1, wherein the first electrode is reflective.

10. The organic light-emitting diode (OLED) device of claim 1, wherein the first electrode comprises multiple layers including a transparent layer and a reflective layer, and wherein the reflective layer comprises a scattering surface or wherein the first electrode further comprises a scattering layer between the transparent and reflective layers.

11. The organic light-emitting diode (OLED) device of claim 1, wherein the contrast enhancement element comprising a transparent film on or in which the light-absorbing layer and the reflective layers are patterned.

12. The organic light-emitting diode (OLED) device of claim 1, wherein the sides of the holes are reflective and/or coated with a reflective material.

13. The organic light-emitting diode (OLED) device of claim 1, wherein the contrast enhancement element is formed on or adjacent to the transparent electrode or a protective layer formed on the transparent electrode.

14. The organic light-emitting diode (OLED) device of claim 1, wherein the light absorbing layer comprises carbon black or a circular polarizer.

15. An organic light-emitting diode (OLED) device comprising:

a first electrode and a second transparent electrode having one or more organic layers formed there-between, at least one organic layer being light-emitting;

a contrast enhancement element formed on a side of the second transparent electrode opposite the organic layers, wherein the contrast enhancement element comprises a patterned reflective layer for reflecting emitted light and a corresponding light-absorbing layer for absorbing ambient light, wherein the patterned reflective layer is located between the light-absorbing layer and the second transparent electrode and wherein the corresponding layers form one or more transparent openings through the reflective and light-absorbing layers so that light emitted by the light-emitting organic layer passes through the transparent openings; and a substrate or a cover through which light is emitted and a scattering layer, wherein the openings in the contrast enhancement element form a low-index element having a refractive index lower than the refractive index range of the organic layers and of the substrate or cover through which light is emitted, and wherein the low-index element is between the scattering layer and the substrate or cover through which light is emitted.

16. The organic light-emitting diode (OLED) device of claim 1, wherein the reflective layer forms a planar reflective surface, an angled segmented reflective surface, or a curved reflective surface.

17. The organic light-emitting diode (OLED) device of claim 1, wherein the first or second electrode is patterned to form multiple light-emitting areas each having first and second distances in at least two dimensions and wherein the openings in the contrast enhancement element are spaced apart by a distance equal to or smaller than the distance in each dimension.

18. The organic light-emitting diode (OLED) device of claim 1, wherein the first or second electrode is patterned to form multiple light-emitting areas and wherein one or more openings in the contrast enhancement element are located over each light-emitting area.

19. The organic light-emitting diode (OLED) device of claim 1, wherein the first and second electrodes form one or more light-emitting areas and wherein a plurality of openings in the contrast enhancement element are located over each light-emitting area.

* * * * *

UNITED STATES PATENT AND TRADEMARK OFFICE
CERTIFICATE OF CORRECTION

PATENT NO. : 7,402,951 B2  Page 1 of 1
APPLICATION NO. : 11/235832
DATED : July 22, 2008
INVENTOR(S) : Ronald S. Cok

It is certified that error appears in the above-identified patent and that said Letters Patent is hereby corrected as shown below:

Column 11, line 8    "lift absorbing" should be replaced with --light-absorbing--.

Column 11, line 13   "though" should be replaced with --through--.

Signed and Sealed this

Twenty-third Day of December, 2008

JON W. DUDAS
*Director of the United States Patent and Trademark Office*